United States Patent
Hasegawa et al.

(10) Patent No.: US 9,288,903 B2
(45) Date of Patent: Mar. 15, 2016

(54) PRINTED CIRCUIT BOARD AND METHOD OF MANUFACTURING THE SAME

(75) Inventors: Mineyoshi Hasegawa, Ibaraki (JP); Keisuke Okumura, Ibaraki (JP); Shinichi Inoue, Ibaraki (JP); Hiroyuki Hanazono, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 269 days.

(21) Appl. No.: 13/094,941

(22) Filed: Apr. 27, 2011

(65) Prior Publication Data
US 2012/0024581 A1    Feb. 2, 2012

(30) Foreign Application Priority Data
Jul. 30, 2010   (JP) ................... 2010-172617

(51) Int. Cl.
| H05K 1/00 | (2006.01) |
| H05K 1/03 | (2006.01) |
| H01B 3/44 | (2006.01) |
| H05K 3/06 | (2006.01) |
| H05K 3/10 | (2006.01) |
| H05K 3/28 | (2006.01) |

(52) U.S. Cl.
CPC ............ *H05K 1/034* (2013.01); *H01B 3/445* (2013.01); *H05K 1/0393* (2013.01); *H05K 3/06* (2013.01); *H05K 3/108* (2013.01); *H05K 3/28* (2013.01); *H05K 2201/015* (2013.01); *H05K 2201/0116* (2013.01)

(58) Field of Classification Search
CPC ....................................... H01B 3/445
USPC .......... 174/258, 255, 250; 257/746, 759; 428/209, 304.4, 901, 36.5; 361/746, 361/759
See application file for complete search history.

(56) References Cited

U.S. PATENT DOCUMENTS

| 4,640,866 A | 2/1987 | Suzuki | |
| 4,916,017 A * | 4/1990 | Nomi et al. | 428/413 |
| 5,910,354 A * | 6/1999 | Meola et al. | 428/198 |
| 7,787,256 B2 * | 8/2010 | Chan et al. | 361/760 |
| 8,134,081 B2 * | 3/2012 | Sakurai et al. | 174/256 |
| 2003/0022102 A1 * | 1/2003 | Hiraoka et al. | 430/270.1 |
| 2003/0082363 A1 | 5/2003 | Nakagiri et al. | |

(Continued)

FOREIGN PATENT DOCUMENTS

| CN | 1606897 A | 4/2005 |
| CN | 101170875 A | 4/2008 |

(Continued)

OTHER PUBLICATIONS

Search Report issued Sep. 4, 2012 in EP Application No. 11164848.1.

(Continued)

*Primary Examiner* — Yuriy Semenenko
(74) *Attorney, Agent, or Firm* — Panitch Schwarze Belisario & Nadel LLP

(57) ABSTRACT

A plurality of conductor traces are formed on a porous base insulating layer made of porous ePTFE. Each conductor trace has a laminated structure of a seed layer and a conductor layer. A cover insulating layer is formed on the base insulating layer to cover each conductor trace. The ePTFE used as the porous base insulating layer has continuous pores. An average pore size of the ePTFE is not less than 0.05 μm and not more than 1.0 μm.

12 Claims, 4 Drawing Sheets

(56) References Cited

U.S. PATENT DOCUMENTS

| | | |
|---|---|---|
| 2003/0129379 A1 | 7/2003 | Yao et al. |
| 2004/0166297 A1 | 8/2004 | Yao et al. |
| 2004/0241419 A1 | 12/2004 | Yao et al. |
| 2004/0247858 A1* | 12/2004 | Wu et al. ............... 428/323 |
| 2007/0059517 A1 | 3/2007 | Yao et al. |
| 2007/0275222 A1 | 11/2007 | Yao et al. |
| 2008/0006605 A1 | 1/2008 | Uenoyama et al. |
| 2008/0264676 A1 | 10/2008 | Okabe et al. |
| 2008/0298036 A1* | 12/2008 | Yamazaki et al. ........... 361/785 |
| 2009/0195998 A1 | 8/2009 | Ishimaru et al. |
| 2012/0006592 A1* | 1/2012 | Ouchi et al. ............ 174/267 |
| 2012/0111607 A1 | 5/2012 | Okabe et al. |

FOREIGN PATENT DOCUMENTS

| | | |
|---|---|---|
| CN | 101315983 A | 12/2008 |
| EP | 0160439 A2 | 11/1985 |
| EP | 0396954 * | 11/1990 |
| EP | 1791408 A1 | 5/2007 |
| JP | S54-76668 A | 6/1979 |
| JP | 60-214941 A | 10/1985 |
| JP | S64-42890 A | 2/1989 |
| JP | H02-49544 B2 | 10/1990 |
| JP | H05-243697 A | 9/1993 |
| JP | H06-224526 A | 8/1994 |
| JP | 06244537 * | 9/1994 |
| JP | H06-244537 A | 9/1994 |
| JP | 09-302121 A | 11/1997 |
| JP | 2000319442 | 11/2000 |
| JP | 2003-200535 A | 7/2003 |
| JP | 2003201362 | 7/2003 |
| JP | 2004-082372 A | 3/2004 |
| JP | 2008258482 A | 10/2008 |
| TW | 200947635 A | 11/2009 |

OTHER PUBLICATIONS

Office Action issued Oct. 8, 2013 in JP Application No. 2010-172617.

Office Action issued Nov. 17, 2014 in CN Application No. 201110217062.4.

Office Action issued Mar. 26, 2015 in TW Application No. 100114056.

Office Action issued May 18, 2015 in CN Application No. 201110217062.4.

* cited by examiner

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Cells such as fuel cells or electronic equipment such as hard disk drives employ printed circuit boards as transmission paths of electrical signals among circuit elements. A resist layer having a given pattern is formed on a conductive layer on a base insulating layer during manufacture of the printed circuit board. In this state, an exposed region of the conductive layer is subjected to etching using an etching solution, thereby forming a given conductor pattern. After that, the resist layer is removed. A cover insulating layer is formed to cover the conductor pattern. In this manner, the printed circuit board having the desired conductor pattern can be manufactured by subjecting the conductive layer to the etching (see JP 2008-258482 A, for example).

A material for the base insulating layer of the printed circuit board is optimally selected depending on uses of the printed circuit board. For example, the use of a porous polyimide film as the base insulating layer has been proposed in JP 2000-319442 A and JP 2003-201362 A. This reduces a dielectric constant of the base insulating layer.

However, the polyimide film used as the base insulating layer of JP 2000-319442 A has fine continuous pores. Therefore, a chemical solution such as an etching solution enters the continuous pores of the polyimide film to flow to a back surface of the base insulating layer during manufacture of the printed circuit board of JP 2000-319442 A. Alternatively, the chemical solution remains in the continuous pores of the polyimide film.

Meanwhile, the polyimide film used as the base insulating layer of JP 2003-201362 A does not have the continuous pores, and therefore the chemical solution will not enter the porous material during manufacture of the printed circuit board of JP 2003-201362 A. However, it is considered that the dielectric constant of the base insulating layer of JP 2003-201362 A is larger than the dielectric constant of the base insulating layer of JP 2000-319442 A.

BRIEF SUMMARY OF THE INVENTION

An object of the present invention is to provide a printed circuit board and a method of manufacturing the same capable of preventing a solution from entering and remaining in a porous material, and reducing a dielectric constant of an insulating layer.

(1) According to an aspect of the present invention, a printed circuit board includes an insulating layer made of a porous material having continuous pores, and a conductor layer having a given pattern provided on the insulating layer, wherein the porous material includes porous polytetrafluoroethylene, and an average pore size of the continuous pores of the polytetrafluoroethylene is not more than 1.0 µm.

In the printed circuit board, the polytetrafluoroethylene of the insulating layer has the continuous pores whose average pore size is not more than 1.0 µm. This prevents the processing solution from entering the continuous pores of the polytetrafluoroethylene when the conductor layer having the given pattern is formed using the processing solution. Since the polytetrafluoroethylene has higher water repellency than other resin such as polyimide, the processing solution is prevented from remaining in the continuous pores even when the processing solution enters the continuous pores of the polytetrafluoroethylene.

The insulating layer is made of the porous polytetrafluoroethylene having the continuous pores. This results in a lower dielectric constant of the insulating layer than that of an insulating layer made of other resin such as polyimide.

This prevents the solution from entering and remaining in the porous material, and reduces the dielectric constant of the insulating layer.

(2) The average pore size of the continuous pores of the polytetrafluoroethylene may be not more than 0.2 µm. In this case, the processing solution is sufficiently prevented from entering the continuous pores of the polytetrafluoroethylene when the conductor layer having the given pattern is formed using the processing solution.

(3) The average pore size of the continuous pores of the polytetrafluoroethylene may be not more than 0.1 µm. In this case, the processing solution is further sufficiently prevented from entering the continuous pores of the polytetrafluoroethylene when the conductor layer having the given pattern is formed using the processing solution.

(4) The polytetrafluoroethylene may be expanded polytetrafluoroethylene. In this case, the porous polytetrafluoroethylene having the continuous pores can be easily formed.

(5) According to another aspect of the present invention, a method of manufacturing a printed circuit board includes the steps of preparing an insulating layer made of a porous material having continuous pores, and forming a conductor layer having a given pattern on the insulating layer using a processing solution, wherein the porous material includes porous polytetrafluoroethylene, and an average pore size of the continuous pores of the polytetrafluoroethylene is not more than 1.0 µm.

In the method of manufacturing the printed circuit board, the polytetrafluoroethylene of the insulating layer has the continuous pores whose average pore size is not more than 1.0 µm. This prevents the processing solution from entering the continuous pores of the polytetrafluoroethylene when the conductor layer having the given pattern is formed using the processing solution. Since the polytetrafluoroethylene has higher water repellency than other resin such as polyimide, the processing solution is prevented from remaining in the continuous pores even when the processing solution enters the continuous pores of the polytetrafluoroethylene.

The insulating layer is made of the porous polytetrafluoroethylene having the continuous pores. This results in a lower dielectric constant of the insulating layer than that of an insulating layer made of other resin such as polyimide.

This prevents the solution from entering and remaining in the porous material, and reduces the dielectric constant of the insulating layer.

Other features, elements, characteristics, and advantages of the present invention will become more apparent from the following description of preferred embodiments of the present invention with reference to the attached drawings.

DETAILED DESCRIPTION OF THE INVENTION

Description will be made of a flexible printed circuit board according to one embodiment of the present invention with reference to the drawings. In the following description, the flexible printed circuit board is abbreviated as the printed circuit board.

(1) Configuration of the Printed Circuit Board

Figure 1:
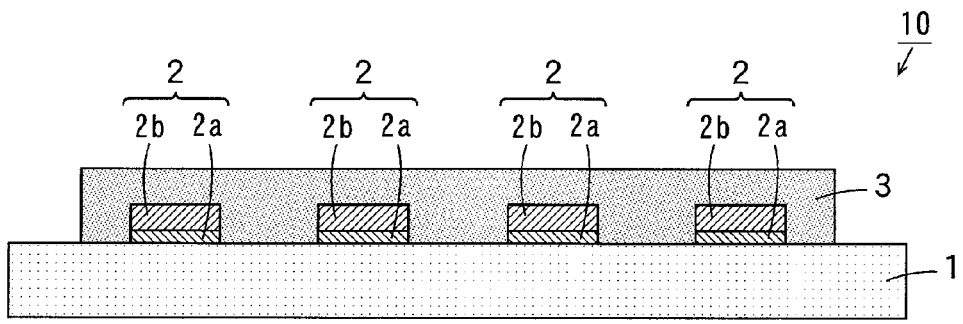
FIG. 1 is a schematic sectional view of a printed circuit board according to one embodiment of the present invention.

FIG. 1 is a schematic sectional view of the printed circuit board according to the one embodiment of the present invention. As shown in FIG. 1, a plurality of conductor traces 2 are formed on a porous base insulating layer 1 made of ePTFE (expanded polytetrafluoroethylene). Porous PTFE having continuous pores can be easily formed by using the ePTFE.

Each conductor trace 2 is a wiring trace or a ground trace. Each conductor trace 2 has a laminated structure of a seed layer 2a made of a laminated film of chromium and copper, for example, and a conductor layer 2b made of copper, for example. A cover insulating layer 3 is formed on the base insulating layer 1 to cover each conductor trace 2.

The cover insulating layer 3 may be formed on the base insulating layer 1 to cover the entire conductor traces 2, or may be formed on the base insulating layer 1 to cover part of the conductor traces 2.

The ePTFE used as the porous base insulating layer 1 has continuous pores. The average pore size of the ePTFE is not less than 0.05 μm and not more than 1.0 μm, preferably not less than 0.05 μm and not more than 0.2 μm, and more preferably not less than 0.05 μm and not more than 0.1 μm.

The thickness of the porous base insulating layer 1 is not less than 1 μm and not more than 500 μm, preferably not less than 10 μm and not more than 200 μm, and more preferably not less than 10 μm and not more than 100 μm, for example. The porous base insulating layer 1 having the thickness of not more than 500 μm improves its flexibility, and the porous base insulating layer 1 having the thickness of not less than 1 μm improves its insulation characteristics.

The thickness of the seed layer 2a is preferably not less than 0.05 μm and not more than 1 μm. The thickness of each of the conductor traces 2 is not less than 1 μm and not more than 100 μm, and preferably not less than 10 μm and not more than 50 μm, for example.

The thickness of the cover insulating layer 3 is not less than 1 μm and not more than 500 μm, preferably not less than 10 μm and not more than 200 μm, and more preferably not less than 10 μm and not more than 100 μm, for example. The cover insulating layer 3 having the thickness of not more than 500 μm improves its flexibility. The cover insulating layer 3 having the thickness of not less than 1 μm improves its insulation characteristics.

(2) First Method of Manufacturing the Printed Circuit Board

Figure 2:
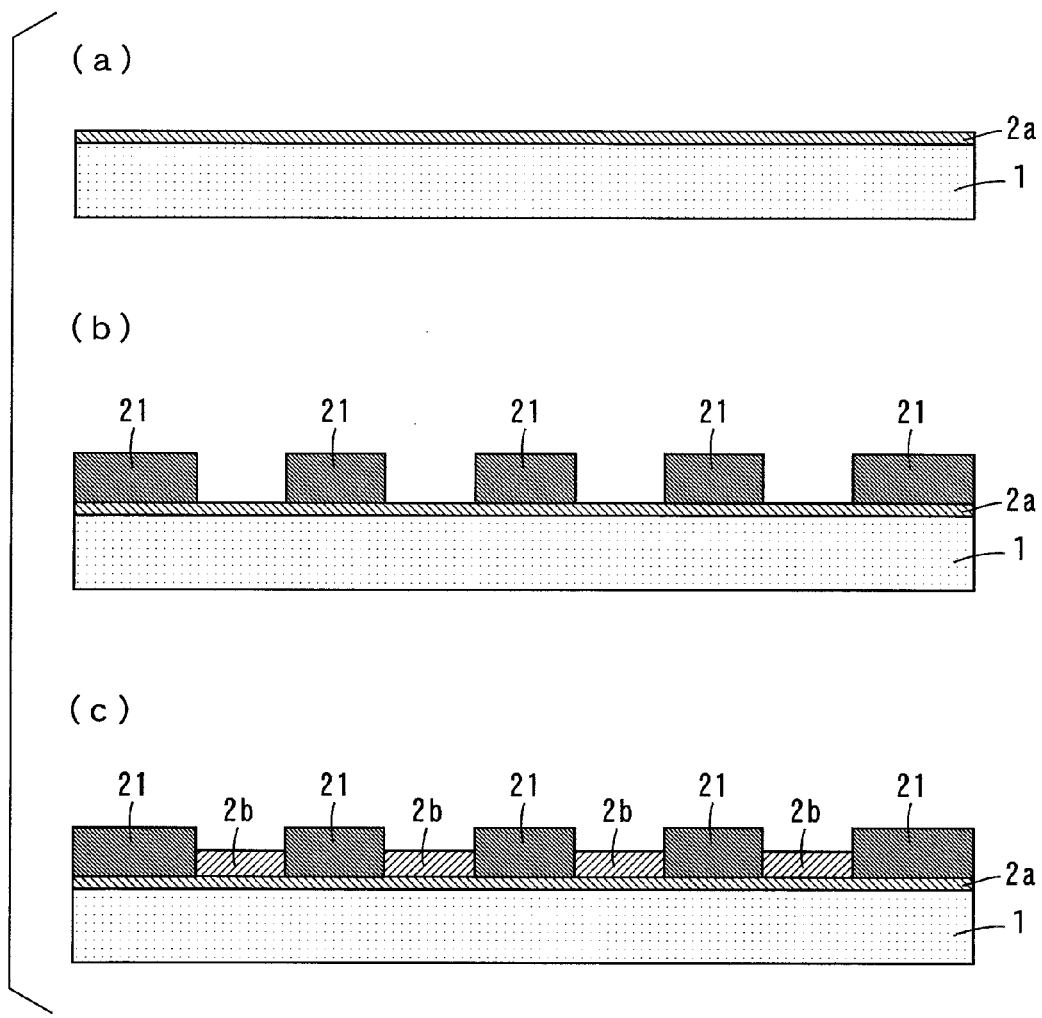
FIGS. 2 (a) to (c) are sectional views for illustrating steps in a first method of manufacturing the printed circuit board.
Figure 3:
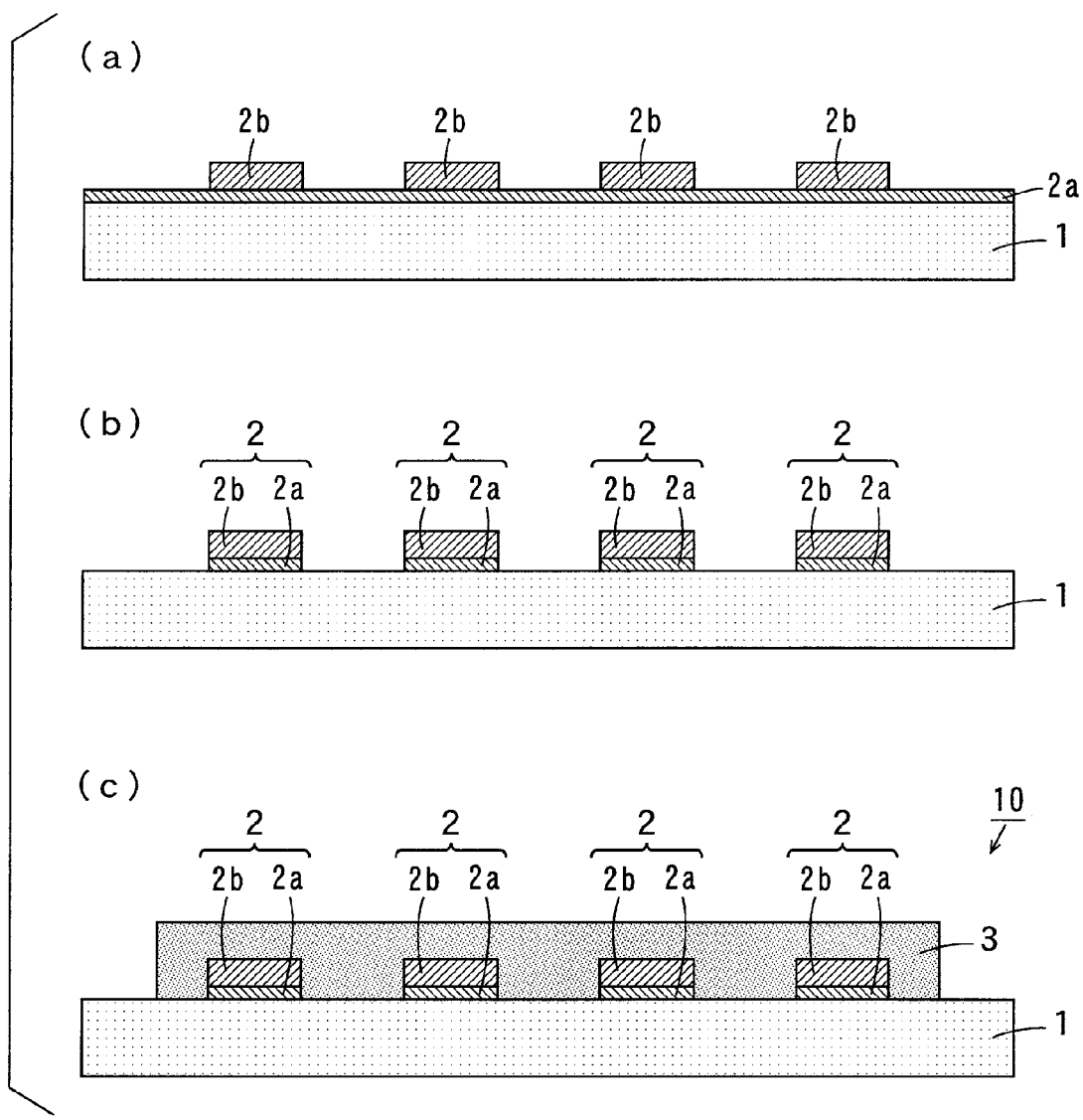
FIGS. 3 (a) to (c) are sectional views for illustrating steps in the first method of manufacturing the printed circuit board.

FIGS. 2 and 3 are sectional views for illustrating steps in a first method of manufacturing the printed circuit board 10. The example of FIG. 2 shows the method of manufacturing the printed circuit board 10 by a semi-additive method.

First, the seed layer 2a made of the laminated film of chromium and copper, for example, is formed on the porous base insulating layer 1 made of ePTFE by a sputtering method, for example, as shown in FIG. 2 (a). The seed layer 2a may be formed by electroless plating. After that, the seed layer 2a is smoothed using a smoothing solution such as potassium persulfate (a smoothing step).

Next, a resist film is formed of a dry film resist or the like on the seed layer 2a, and the resist film is exposed using a mask having a given pattern, and then developed using a developing solution such as sodium carbonate (a developing step). In this manner, a plating resist 21 is formed on the seed layer 2a as shown in FIG. 2 (b).

The conductor layer 2b made of copper, for example, is subsequently formed on the seed layer 2a excluding a region of the plating resist 21 by electrolytic plating using a plating solution such as copper sulfate as shown in FIG. 2 (c) (a plating step).

Next, the plating resist 21 is removed by chemical etching (wet etching) or stripping using a stripping solution such as sodium hydrate as shown in FIG. 3 (a) (a stripping step). An exposed region of the seed layer 2a is then removed by etching using an etching solution such as ferric chloride (an etching step). Thus, the plurality of conductor traces 2 each composed of the seed layer 2a and the conductor layer 2b are formed as shown in FIG. 3 (b). Each conductor trace 2 is a wiring trace or a ground trace, for example.

As shown in FIG. 3 (c), the cover insulating layer 3 made of polyimide, for example, is formed on the porous base insulating layer 1 to cover the plurality of conductor traces 2. Accordingly, the printed circuit board 10 shown in FIG. 1 is completed. The printed circuit board 10 is cleaned using pure water at a temperature of 20° C. or pure water at a temperature of 80° C. (a cleaning step) during or after the foregoing steps.

(3) Second Method of Manufacturing the Printed Circuit Board

Figure 4:
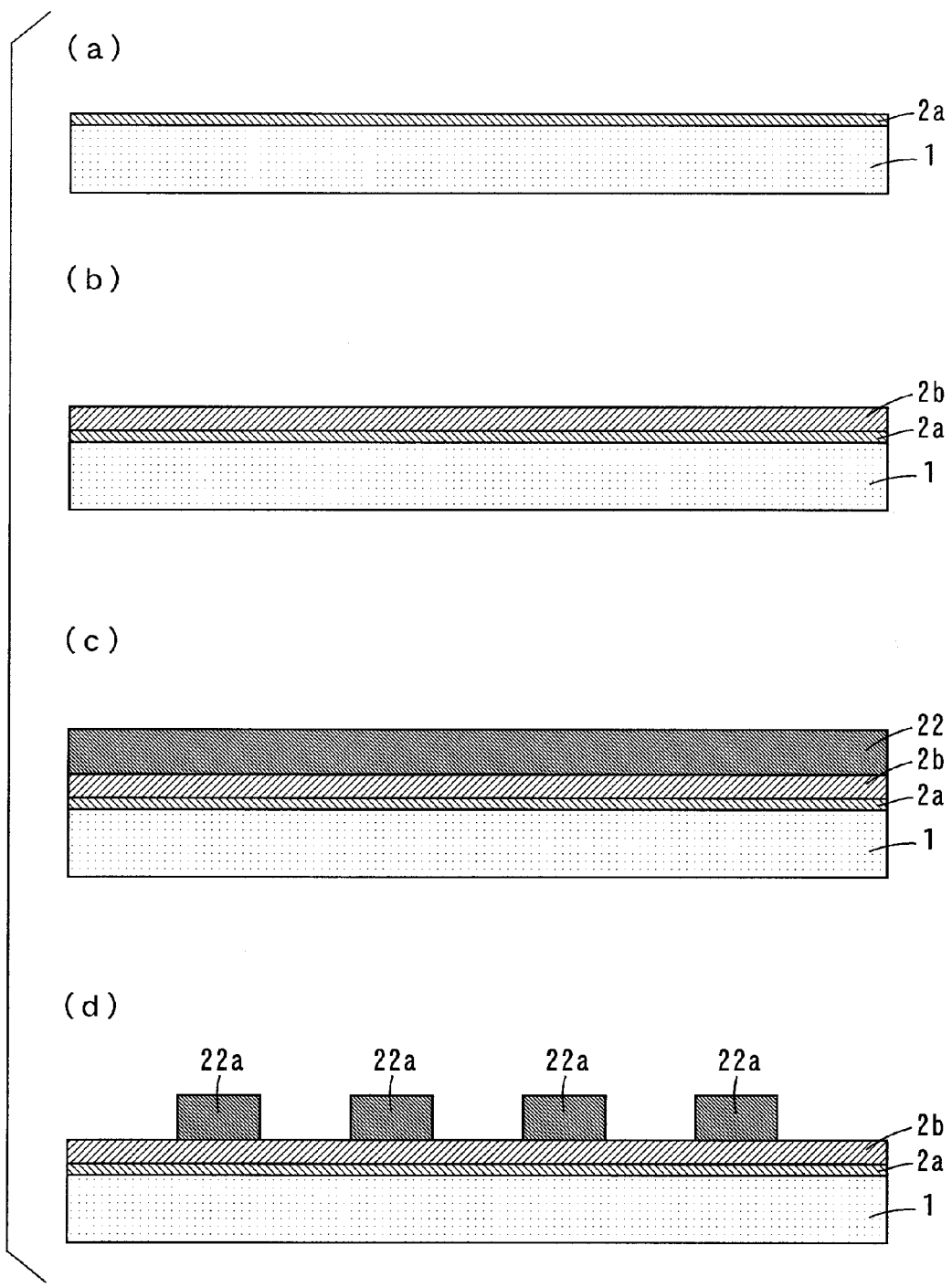
FIGS. 4 (a) to (d) are sectional views for illustrating steps in a second method of manufacturing the printed circuit board.
Figure 5:
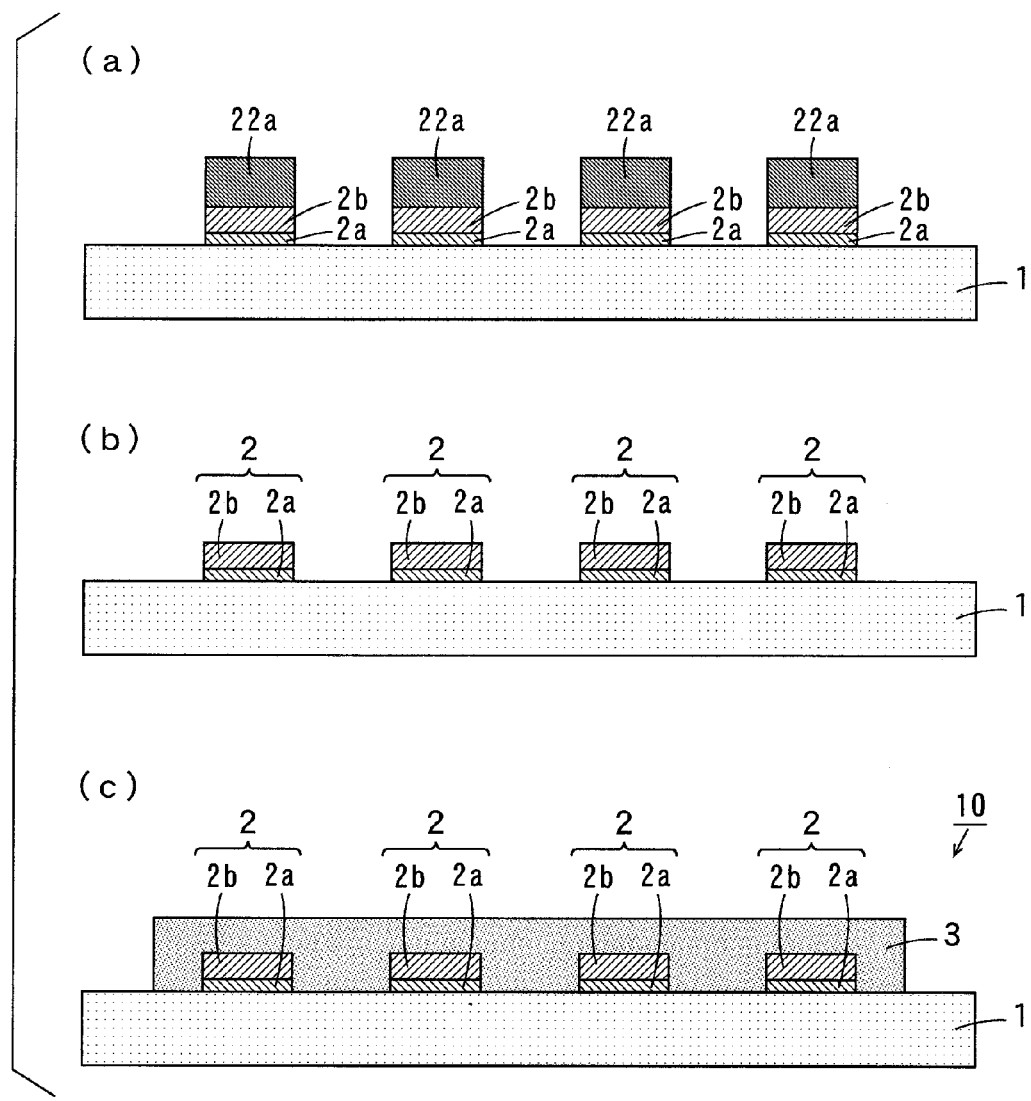
FIGS. 5 (a) to (c) are sectional views for illustrating steps in the second method of manufacturing the printed circuit board.

FIGS. 4 and 5 are sectional views for illustrating steps in a second method of manufacturing the printed circuit board 10. The example of FIG. 4 shows the method of manufacturing the printed circuit board 10 by a subtractive method.

First, the seed layer 2a made of the laminated film of chromium and copper, for example, is formed on the porous base insulating layer 1 made of ePTFE by the sputtering method, for example, as shown in FIG. 4 (a). The seed layer 2a may be formed by electroless plating.

Next, the conductor layer 2b made of copper, for example, is formed on the entire seed layer 2a by electrolytic plating using a plating solution such as copper sulfate as shown in FIG. 4 (b) (a plating step). After that, the conductor layer 2b is smoothed using a smoothing solution such as potassium persulfate (a smoothing step).

The resist film 22 is subsequently formed of a photosensitive dry film resist, for example, on the conductor layer 2b as shown in FIG. 4 (c). The resist film 22 is exposed in the given pattern and then developed using the developing solution such as sodium carbonate or the like (a developing step), so that the etching resist 22a is formed as shown in FIG. 4 (d).

Then, an exposed region of the conductor layer 2b and an exposed region of the seed layer 2a that are not covered with the etching resist 22a are removed by etching using the etching solution such as ferric chloride (an etching step) as shown in FIG. 5 (a). After that, the etching resist 22a is removed by the stripping solution such as sodium hydrate (a stripping step). Thus, the plurality of conductor traces 2 each composed of the seed layer 2a and the conductor layer 2b are formed as shown in FIG. 5 (b). Each conductor trace 2 is a wiring trace or a ground trace, for example.

As shown in FIG. 5 (c), the cover insulating layer 3 made of polyimide, for example, is formed on the porous base insulating layer 1 to cover the plurality of conductor traces 2. Accordingly, the printed circuit board 10 shown in FIG. 1 is completed. The printed circuit board 10 is cleaned using pure water at a temperature of 20° C. or pure water at a temperature of 80° C. (a cleaning step) during or after the foregoing steps.

(4) Other Embodiments

The material for the cover insulating layer 3 is not limited to polyimide. For example, ePTFE may be used similarly to the base insulating layer 1.

The seed layer 2a may be a single layer film of chromium, for example, not limited to the laminated film of chromium and copper.

The material for the conductor layer 2b is not limited to copper. For example, another metal material such as a copper alloy, gold and aluminum may be used.

The seed layer 2a may not be formed when the conductor layer 2b is formed by another method instead of the electrolytic plating.

(5) Effects

In the printed circuit board 10 according to the one embodiment of the present invention, the ePTFE of the base insulating layer 1 has the continuous pores whose average pore size is not more than 1.0 µm. This prevents the processing solution from entering the continuous pores of the ePTFE when the conductor traces 2 are formed using the processing solution. Since the ePTFE has higher water repellency than other resin such as polyimide, the processing solution is prevented from remaining in the continuous pores even when the processing solution enters the continuous pores of the ePTFE.

The relative dielectric constant of PTFE is 2.1, and the relative dielectric constant of polyimide is 3.5. The relative dielectric constant of the porous ePTFE having the continuous pores is even lower. This causes the dielectric constant of the base insulating layer 1 to be sufficiently lower than the dielectric constant of a base insulating layer made of other resin such as polyimide.

This prevents the processing solution from entering and remaining in the porous material, and reduces the dielectric constant of the base insulating layer 1. The average pore size of the continuous pores of the ePTFE is not more than 0.2 µm, thereby sufficiently preventing the processing solution from entering the continuous pores of the ePTFE. The average pore size of the continuous pores of the ePTFE is not more than 0.1 µm, thereby more sufficiently preventing the processing solution from entering the continuous pores of the ePTFE. The dielectric constant of the base insulating layer 1 is reduced, resulting in lower loss to be caused by dielectrics of the conductor traces 2.

The coefficient of friction of PTFE is smaller than the coefficient of friction of other resin such as polyimide, thus improving wear resistance of the base insulating layer 1. In addition, the printed circuit board 10 can be easily inserted into a narrow space, thus improving working efficiency.

Since the modulus of elasticity of PTFE is smaller than the modulus of elasticity of other resin such as polyimide, flexibility and bending characteristics of the base insulating layer 1 can be improved. The resistivity of PTFE (not less than $1 \times 10^{18}$ Ω·cm) is higher than the resistivity of polyimide ($1 \times 10^{16}$ Ω·cm), thus eliminating the need to increase the thickness of the base insulating layer 1 in order to ensure insulation of the base insulating layer 1. This results in more improved flexibility and bending characteristics of the base insulating layer 1 than flexibility and bending characteristics of a base insulating layer made of other resin such as polyimide.

(6) Correspondences Between Elements in the Claims and Parts in Embodiments

In the following paragraph, non-limiting examples of correspondences between various elements recited in the claims below and those described above with respect to various preferred embodiments of the present invention are explained.

In the above-described embodiment, the base insulating layer 1 is an example of an insulating layer, and the conductor trace 2 is an example of a conductor layer.

As each of various elements recited in the claims, various other elements having configurations or functions described in the claims can be also used.

(7) Inventive Examples and Comparative Examples

In inventive examples 1 to 5 and a comparative example 1, printed circuit boards 10 having porous base insulating layers 1 of different average pore sizes were manufactured based on the foregoing first method of manufacturing the printed circuit board. In inventive examples 6 to 10 and a comparative example 2, printed circuit boards 10 having porous base insulating layers 1 of different average pore sizes were manufactured based on the foregoing second method of manufacturing the printed circuit board.

PTFE porous films (TEMISH (registered trademark) NTF1121 by Nitto Denko Corporation) were used as the base insulating layers 1 in the printed circuit boards 10 of the inventive examples 1 and 6. The average pore size of the base insulating layer 1 was 0.1 µm, and the thickness of the base insulating layer 1 was 70 µm.

PTFE porous films (TEMISH NTF1122 by Nitto Denko Corporation) were used as the base insulating layers 1 in the printed circuit boards 10 of the inventive examples 2 and 7. The average pore size of the base insulating layer 1 was 0.2 µm, and the thickness of the base insulating layer 1 was 75 µm.

PTFE porous films (TEMISH NTF1125 by Nitto Denko Corporation) were used as the base insulating layers 1 in the printed circuit boards 10 of the inventive examples 3 and 8. The average pore size of the base insulating layer 1 was 0.5 µm, and the thickness of the base insulating layer 1 was 68 µm.

PTFE porous films (TEMISH NTF1128 by Nitto Denko Corporation) were used as the base insulating layers 1 in the printed circuit boards 10 of the inventive examples 4 and 9. The average pore size of the base insulating layer 1 was 0.8 µm, and the thickness of the base insulating layer 1 was 80 µm.

PTFE porous films (TEMISH NTF1131 by Nitto Denko Corporation) were used as the base insulating layers 1 in the printed circuit boards 10 of the inventive examples 5 and 10. The average pore size of the base insulating layer 1 was 1.0 µm, and the thickness of the base insulating layer 1 was 82 µm.

PTFE porous films (TEMISH NTF1133 by Nitto Denko Corporation) were used as the base insulating layers 1 in the printed circuit boards 10 of the comparative examples 1 and 2. The average pore size of the base insulating layer 1 was 3.0 µm, and the thickness of the base insulating layer 1 was 86 µm.

In each of the printed circuit boards 10 of the inventive examples 1 to 10 and the comparative examples 1, 2, the seed layer 2a was made of the laminated film of chromium having a thickness of 50 nm and copper having a thickness of 100 nm. The thickness of the conductor layer 2b was 12 µm.

In the first and second methods of manufacturing the printed circuit board, a processing solution was observed whether or not it flowed to the back surface of each of the printed circuit boards 10 of the inventive examples 1 to 10 and the comparative examples 1, 2 through the continuous pores of the base insulating layer 1 during each of the plating step, the smoothing step, the developing step, the etching step, the stripping step and the cleaning step.

The following processing solutions were used in the respective steps: an aqueous solution of copper sulfate in the plating step; an aqueous solution of potassium persulfate in the smoothing step; an aqueous solution of sodium carbonate in the developing step; an aqueous solution of ferric chloride in the etching step; an aqueous solution of sodium hydrate in the stripping step; and pure water at a temperature of 20° C. and pure water at a temperature of 80° C. in the cleaning step.

Table 1 shows results of testing whether the processing solutions flow to the base insulating layer 1 in the printed circuit boards 10 of the inventive examples 1 to 5 and the comparative example 1.

TABLE 1

| PROCESSING SOLUTION (AQUEOUS SOLUTION) | INVENTIVE EXAMPLE 1 0.1 μm | INVENTIVE EXAMPLE 2 0.2 μm | INVENTIVE EXAMPLE 3 0.5 μm | INVENTIVE EXAMPLE 4 0.8 μm | INVENTIVE EXAMPLE 5 1.0 μm | COMPARATIVE EXAMPLE 1 3.0 μm |
|---|---|---|---|---|---|---|
| COPPER SULFATE | ○ | ○ | ○ | ○ | ○ | X |
| POTASSIUM PERSULFATE | ○ | ○ | ○ | ○ | ○ | X |
| SODIUM CARBONATE | ○ | ○ | ○ | ○ | ○ | X |
| FERRIC CHLORIDE | ○ | ○ | ○ | ○ | ○ | X |
| SODIUM HYDRATE | ○ | ○ | ○ | ○ | ○ | X |
| PURE WATER (20° C.) | ○ | ○ | ○ | ○ | ○ | X |
| PURE WATER (80° C.) | ○ | ○ | ○ | ○ | ○ | X |

As shown in Table 1, the processing solutions did not flow to the back surface through the continuous pores of the base insulating layer 1 in the printed circuit boards 10 of the inventive examples 1 to 5. Moreover, the processing solutions did not remain in the continuous pores. Meanwhile, the processing solutions flowed to the back surface through the continuous pores of the base insulating layer 1 in the printed circuit board 10 of the comparative example 1. In addition, the processing solutions remained in the continuous pores.

Table 2 shows results of testing whether the processing solutions flowed to the base insulating layer 1 in the printed circuit boards 10 of the inventive examples 6 to 10 and the comparative example 2.

TABLE 2

| PROCESSING SOLUTION (AQUEOUS SOLUTION) | INVENTIVE EXAMPLE 6 0.1 μm | INVENTIVE EXAMPLE 7 0.2 μm | INVENTIVE EXAMPLE 8 0.5 μm | INVENTIVE EXAMPLE 9 0.8 μm | INVENTIVE EXAMPLE 10 1.0 μm | COMPARATIVE EXAMPLE 2 3.0 μm |
|---|---|---|---|---|---|---|
| COPPER SULFATE | ○ | ○ | ○ | ○ | ○ | X |
| POTASSIUM PERSULFATE | ○ | ○ | ○ | ○ | ○ | X |
| SODIUM CARBONATE | ○ | ○ | ○ | ○ | ○ | X |
| FERRIC CHLORIDE | ○ | ○ | ○ | ○ | ○ | X |
| SODIUM HYDRATE | ○ | ○ | ○ | ○ | ○ | X |
| PURE WATER (20° C.) | ○ | ○ | ○ | ○ | ○ | X |
| PURE WATER (80° C.) | ○ | ○ | ○ | ○ | ○ | X |

As shown in Table 2, the processing solutions did not flow to the back surface through the continuous pores of the base insulating layer 1 in the printed circuit boards 10 of the inventive examples 6 to 10. Moreover, the processing solutions did not remain in the continuous pores. Meanwhile, the processing solutions flowed to the back surface through the continuous pores of the base insulating layer 1 in the printed circuit board 10 of the comparative example 2. In addition, the processing solutions remained in the continuous pores.

The results of the inventive examples 1 to 10 and the comparative examples 1, 2 show that when the average pore size of the porous base insulating layer 1 is not more than 1.0 μm, the processing solutions can be prevented from flowing to the back surface through the continuous pores of the base insulating layer 1 and from remaining in the continuous pores, regardless of the method of manufacturing the printed circuit board 10.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A method of manufacturing a printed circuit board comprising the steps of:

preparing an insulating layer consisting essentially of a porous polytetrafluoroethylene having continuous pores, an average pore size of the continuous pores of said polytetrafluoroethylene being not more than 0.1 µm; and forming a conductor pattern having a given pattern on said insulating layer using a processing solution such that the processing solution is prevented from entering or remaining in the continuous pores of said insulating layer.

2. The method of claim 1, wherein the processing solution includes a developing solution, and wherein said step of forming the conductor pattern comprises:
  forming a resist film;
  exposing the resist film in a given pattern; and
  forming a plating resist by developing the resist film using the developing solution, such that the developing solution is prevented from entering or remaining in the continuous pores of said insulating layer.

3. The method of claim 2, wherein the processing solution includes a plating solution, and wherein said step of forming the conductor pattern further comprises forming the conductor pattern using the plating solution except for in a region of the plating resist, such that the plating solution is prevented from entering or remaining in the continuous pores of said insulating layer.

4. The method of claim 3, wherein the processing solution includes a stripping solution, and wherein said step of forming the conductor pattern further comprises removing the plating resist using the stripping solution, such that the stripping solution is prevented from entering or remaining in the continuous pores of said insulating layer.

5. The method of claim 2, wherein the processing solution includes a smoothing solution, and wherein said step of forming the resist film comprises:
  forming a seed layer on said insulating layer;
  smoothing the seed layer using the smoothing solution, such that the smoothing solution is prevented from entering or remaining in the continuous pores of said insulating layer; and
  forming the resist film on the seed layer.

6. The method of claim 5, wherein the processing solution includes an etching solution, and wherein a step of stripping the plating resist comprises removing the seed layer by etching using the etching solution, such that the etching solution is prevented from entering or remaining in the continuous pores of said insulating layer.

7. The method of claim 1, wherein the processing solution includes a plating solution, and wherein said step of forming the conductor pattern comprises forming by a conductor layer using the plating solution, such that the plating solution is prevented from entering or remaining in the continuous pores of said insulating layer.

8. The method of claim 7, wherein the processing solution includes a developing solution, and wherein said step of forming the conductor pattern further comprises:
  forming a resist film on the conductor layer;
  exposing the resist film in a given pattern; and
  forming an etching resist by developing the resist film using the developing solution, such that the developing solution is prevented from entering or remaining in the continuous pores of said insulating layer.

9. The method of claim 8, wherein the processing solution includes an etching solution, and wherein said step of forming the conductor pattern further comprises removing a region of the conductor layer by etching using the etching solution except for the etching resist, such that the etching solution is prevented from entering or remaining in the continuous pores of said insulating layer.

10. The method of claim 9, wherein the processing solution includes a stripping solution, and wherein said step of forming the conductor pattern further comprises removing the etching resist by stripping using the stripping solution, such that the stripping solution is prevented from entering or remaining in the continuous pores of said insulating layer.

11. The method of claim 7, wherein the processing solution includes a smoothing solution, and wherein said step of forming the conductor layer comprises smoothing the conductor layer using the smoothing solution, such that the smoothing solution is prevented from entering or remaining in the continuous pores of said insulating layer.

12. The method of claim 1, wherein said polytetrafluoroethylene is expanded polytetrafluoroethylene.

* * * * *